(12) United States Patent
Iima

(10) Patent No.: US 8,145,973 B2
(45) Date of Patent: Mar. 27, 2012

(54) DATA PROCESSING APPARATUS AND METHOD, AND PROGRAM

(75) Inventor: Tomofumi Iima, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 762 days.

(21) Appl. No.: 12/343,667

(22) Filed: Dec. 24, 2008

(65) Prior Publication Data

US 2009/0172494 A1 Jul. 2, 2009

(30) Foreign Application Priority Data

Dec. 28, 2007 (JP) ................. 2007-341081

(51) Int. Cl.
*G06F 11/00* (2006.01)
(52) U.S. Cl. ........................... 714/752; 714/701
(58) Field of Classification Search .................. 714/752, 714/758, 701; 341/55, 94
See application file for complete search history.

(56) References Cited

U.S. PATENT DOCUMENTS

| 6,650,638 B1 * | 11/2003 | Walker et al. ................. 370/389 |
| 2005/0097378 A1 * | 5/2005 | Hwang ......................... 713/320 |

FOREIGN PATENT DOCUMENTS

| JP | 2005-130177 | 5/2005 |
| JP | 2005-184801 | 7/2005 |

* cited by examiner

*Primary Examiner* — Robert Beausoliel, Jr.
*Assistant Examiner* — Joseph Kudirka
(74) *Attorney, Agent, or Firm* — Young & Thompson

(57) ABSTRACT

In order to correctly perform error analysis, test, or the like, a 64B/66B converter of a PCS processing unit of a transmitter conforming to 10 GBASE-R PHY performs 64B/66B conversion on data on a block basis that is transmitted over four lanes, the block being formed of two columns. In the conversion, when a control signal inputted via a control signal input terminal indicates a normal operation mode, if an error code in a block to be converted is detected by an error detector, error expansion that replaces all 8 bytes of data in the block with an error code /E/ is performed. In contrast, when the control signal indicates an analysis mode, the error expansion is not performed even if an error code is detected by the error detector.

16 Claims, 17 Drawing Sheets

| CONTROL SIGNAL | MODE | ERROR DETECTION SIGNAL | OUTPUT OF SELECTOR 160 [OUT] |
|---|---|---|---|
| L | NORMAL OPERATION MODE | L | in1 (WITHOUT ERROR EXPANSION) |
| L | NORMAL OPERATION MODE | H | in2 (WITH ERROR EXPANSION) |
| H | ANALYSIS MODE | L | in1 (WITHOUT ERROR EXPANSION) |
| H | ANALYSIS MODE | H | in1 (WITHOUT ERROR EXPANSION) |

Fig. 4

DATA PROCESSING APPARATUS AND METHOD, AND PROGRAM

BACKGROUND

1. Field of the Invention

The present invention relates to data processing and specifically to data processing in a transmitter/receiver for data transmitted over multiple lanes.

2. Description of Related Art

Various interconnection systems based on the OSI (Open Systems Interconnection) Reference Model have been standardized as multi-vendor interconnection international standard protocol systems. In recent years, IEEE (Institute of Electrical and Electronics Engineers) 802.3 in charge of standardizing Ethernet (registered trademark) that is the sublayer MAC (Media Access Control) of the second layer (Data Link Layer) of the OSI Reference Model has standardized 10 Gigabit Ethernet (10 GbE) ten times as fast as Gigabit. Ethernet into IEEE 802.3ae. 10 GbE is being introduced in earnest into LANs (Local Area Networks)/MANs (Metropolitan Area Networks) as well as the backbones of communication carriers.

10 GbE uses the same MAC as conventional Ethernet and inherits the conventional frame format according to its basic concept of using as much of existing technology as possible as long as usable, thereby suppressing development costs and period.

As to the physical layer, 10 GbE has a specification called PHY on the WAN (Wide Area Network) side (WAN PHY), which conventional Ethernet does not have, and as to PHY on the LAN side (LAN PHY), a modified version of that of conventional Ethernet is used.

As to the LAN PHY of 10 GbE, there are several segmented specifications. Here, description will be made taking 10 GBASE-R PHY as an example.

FIG. 10 shows the structure of 10 GBASE-R PHY together with the OSI Reference Model of seven layers. As shown in the figure, 10 GBASE-R PHY consists of RS (Reconciliation Sublayer), XGMII (10 Gigabit Media Independent Interface), PCS (Physical Coding Sublayer), PMA (Physical Medium Attachment), PMD (Physical Medium Dependent), and MDI (Medium Dependent Interface).

RS is a part in between MAC and XGMII that performs signal conversion and is connected to PCS via XGMII.

XGMII deals with a rate of 10 Gbps and functions as the interface between RS and PCS.

PCS is in charge of the coding/decoding and scrambling of data, and 10 GBASE-R PHY uses a method called "64B/66B conversion" specified in IEEE 802.3ae-2002 Clause 49 for coding/decoding. The 64B/66B conversion is a method that expresses 64-bit data in a 66-bit symbol when coding, which converts 64-bit data to a 66-bit expression. When decoding, the opposite of the conversion in coding is performed.

PMA is a serializer/deserializer (hereinafter called a SerDes) that serializes data when transmitting and parallelizes when receiving. Specifically, when transmitting, PMA converts 16-bit parallel data into a serial data stream and passes it to PMD, and when receiving, PMA parallelizes a serial data stream from PMD into 16-bit parallel data.

PMD performs photoelectric signal conversion and is connected to a physical medium via MDI. MDI corresponds to an end connection of an Ethernet cable (an optical cable for 10 GbE).

As shown in FIG. 49-5 of IEEE 802.3ae-2002 Clause 49, PCS performs data passing with XGMII on an 8-byte, i.e. 64-bit, unit basis. Here, XGMII is an interface having a 32-bit width for data. Hence, in transmission, after receiving two cycles worth of data from XGMII, PCS performs 64B/66B conversion, and in reception, PCS divides 64-bit data into two parts, outputting one at a time to XGMII.

Here, the 64B/66B conversion by PCS will be described with reference to FIGS. 11 to 17 taking the transmission as an example.

As shown in FIG. 11, in transmission, signals flow from XGMII 10 to a 64B/66B converter 22 of PCS 20 to a scrambling section 24. A signal flowing through XGMII 10, a signal taken in by the 64B/66B converter 22, and a signal output by the 64B/66B converter 22 are signal A, signal B, and signal C respectively.

FIG. 12 shows the format of signal A flowing through XGMII 10. Signal A includes a control signal TXC[3:0] and a data signal TXD[31:0], which each are transmitted over four lanes: lane 0 to lane 3. As shown in the figure, the data signal TXD[31:0] starts with a frame start code /S/ and ends with a frame end code /T/. While the start code /S/ is always located on lane 0, the lane where the end code /T/ is located differs depending on the length of the frame. As a signal of XGMII, there is a clock signal TX_CLK (not shown) as well as the control signal TXC[3:0] and data signal TXD[31:0]. The control signal TXC[3:0] and data signal TXD[31:0] change synchronously with the rise and fall edges of this clock signal TX_CLK.

The data signal is transmitted on the basis of one byte of data per cycle over each lane (indicated by a small rectangle in the figure). Data on the four lanes in the same cycle together, hatched in FIG. 12, are called a "column". As mentioned above, because PCS 20 takes in 8 bytes of data at a time, the boundary between each 8 bytes of data is called an "8-byte boundary". PCS 20 takes in two columns present between two adjacent 8-byte boundaries at a time. Hereinafter, two columns present between two adjacent 8-byte boundaries together are called a "block".

The format of signal B taken in by the 64B/66B converter 22 of PCS 20 and the format of signal C into which the 64B/66B converter 22 converts the taken-in signal B are shown in FIG. 13.

As shown in FIG. 13, the 64B/66B converter 22 takes in a block (4 bytes×2) consisting of two columns of the data signal TXD in signal A and two columns (4 bits×2) of the control signal TXC transmitted in the same cycles as these two columns to obtain tx_raw[71:0] as the signal B. The tx_raw[71:0] has first 8 bits as the control portion and subsequent 8 bytes, i.e., 64 bits as the data portion, amounting to a total of 72 bits.

The 64B/66B converter 22 performs 64B/66B conversion on the tx_raw[71:0] so as to code it into tx_coded[65:0] as signal C, which is output to the scrambling section 24.

The tx_coded[65:0] has first 2 bits as the sync head for synchronizing and subsequent 64 bits as the data portion, amounting to a total of 66 bits.

FIG. 14 is a diagram of the process by the 64B/66B converter 22, focusing on only the data signal. As shown in the figure, two columns of data from XGMII 10 are encoded by the 64B/66B conversion into 64 bits of data. Note that although data is different in value before and after the 64B/66B conversion, they are both denoted as "D" for convenience of expression.

Here, the case where there is an error code in the data signal TXD from XGMII will be described. FIG. 15 shows an example where an error code /E/ is included in the data signal TXD. The bit pattern of the error code /E/ in XGMII is FEh in hexadecimal, but a byte in the data signal TXD is not interpreted as the error code if the value of the byte is FEh, without any other condition. If the logic value on the same lane of the control signal TXC (TXC[1] in FIG. 15) at the same cycle as the byte is a Hi (high) with the value of the byte being FEh, the byte is interpreted as the error code.

When 64B/66B-converting data containing the error code as shown in FIG. 15, the 64B/66B converter 22 performs a process called error expansion. FIGS. 16, 17 show schematically the error expansion.

If the error code /E/ is included in a block of the data signal TXD as shown in FIG. 16, a total of 8 bytes of two columns included in this block are all made to be an error code by the error expansion during the 64B/66B conversion. Note that although the bit pattern of the error code after the 64B/66B conversion is 1Eh in hexadecimal, it is denoted as /E/, which is the same as the error code before the 64B/66B conversion, for convenience of expression.

FIG. 16 shows an example where the error code /E/ is included in the one adjacent to the preceding 8-byte boundary of the two columns in a block of the data signal TXD. FIG. 17 shows an example where the error code /E/ is included in the one adjacent to the subsequent 8-byte boundary of the two columns in a block of the data signal TXD. As shown in FIG. 17, also in this case, the 8 bytes of the block including the error code /E/ are all replaced with the error code by the error expansion.

This error expansion is performed likewise on the receiver side as well, not being limited to the transmitter side. This has the advantage that other devices and process blocks can be reliably notified of the error if an error exists in a frame being transmitted or received.

Meanwhile, in communication systems, error analysis or the performance test of transmitters/receivers may be performed. Accordingly various devices are implemented to better perform the analysis or the test.

Japanese Unexamined Patent Application Publication No. 2005-130177 (Reference 1) discloses a technique where a capture apparatus analyzes data input from a transmission line and divides the data into lanes of data to be displayed on a byte-unit basis. According to this technique, data is divided into lanes of data to be displayed, and hence it is expected to be easy to perform error analysis.

Japanese Unexamined Patent Application Publication No. 2005-184801 (Reference 2) discloses a technique where an error area is extended intentionally by a testing apparatus that corresponds to a transmitter for frames. This technique, expecting that in the 64B/66B conversion the error code /E/ is expanded to 8 bytes, replaces the 12 bytes of a total of three columns, a column including the error code /E/ and its preceding and following columns, with the error code /E/ and then performs FCS computation. By this means, a frame including no FCS error but the error codes /E/ and frames including no error code can be mixed and given to a test subject apparatus, and thus it becomes easy to confirm whether the subject apparatus can discard only the frame including the error codes.

SUMMARY

When performing error analysis, it is important on which lanes of which columns of a frame the error codes /E/ exist, that is, the accurate positions and the number of the error codes /E/. If the error code /E/ occurs in the higher layer on the transmitter side, all data of the block (two columns) including the error code /E/ are replaced with the error code /E/ by the 64B/66B converter of PCS, and hence the receiver cannot realize the accurate positions and the number of the error codes /E/. Also, if an error occurs on a transmission line, all data of the block including the error code /E/ are replaced with the error code /E/ by PCS on the receiver side, and hence the same problem may occur.

Further, as shown in FIG. 18, if the error code /E/ is located near the end code /T/, and the error code /E/ and the end code /T/ are in the same block, the end code /T/ is overwritten by the error expansion during the 64B/66B conversion. In this case, even if a non-erroneous frame follows the erroneous frame including the error code /E/, the frame receiver side will regard this non-erroneous frame as an erroneous frame or part of its preceding erroneous frame due to the preceding erroneous frame. This is because, since the end code /T/ of the preceding erroneous frame is overwritten, it is thought that the start code /S/ falsely appeared while a frame continues. Thus, where counters for frame attributes such as the number of frames and frame lengths are provided on the frame receiver side, correct counts cannot be obtained, and the problem occurs that correct analysis cannot be executed.

Neither of the techniques disclosed in Reference 1 and Reference 2 can solve the above problem.

According to an aspect of the present invention, there is provided a data processing apparatus. This data processing apparatus comprises an error detector to detect an error code in data that is transmitted over a plurality of lanes; a data converter to perform data conversion on the data on a block basis, the block being formed of a predetermined number of columns; and a control signal input terminal via which to input a control signal indicating a normal operation mode or an analysis mode.

The data converter, when the control signal inputted via the control signal input terminal indicates the normal operation mode, performs error expansion that replaces each data in a block where the error code detected by the error detector exists with an error code and, when the control signal inputted via the control signal input terminal indicates the analysis mode, does not perform the error expansion.

Here, the "column" refers to a group of data on the lanes in the same cycle from among data that are transmitted over a plurality of lanes.

The analysis mode refers to a processing mode such as error analysis or test where especially the accurate positions and the number of error codes need to be obtained, other than the normal operation mode.

In addition to the apparatus according to the above aspect, according to other aspects, the present invention can be embodied as a method, a system, and a program to make a computer operate as the above apparatus.

According to the technique of the present invention, in a system where data is transmitted over a plurality of lanes and error expansion is performed, error analysis, test, or the like can be correctly executed.

BRIEF DESCRIPTION OF THE DRAWINGS

The above and other objects, advantages and features of the present invention will be more apparent from the following description of certain exemplary embodiments taken in conjunction with the accompanying drawings, in which:

FIG. 4 is a view for explaining the process in a selector of the 64B/66B converter shown in FIG. 3;

DETAILED DESCRIPTION OF THE EXEMPLARY EMBODIMENTS

Embodiments of the present invention will be described below with reference to the drawings. In the description below, a "transmitter" is not limited to an apparatus performing transmission only, but also refers to the transmitting section of a communication apparatus that transmits and receives. Likewise, a "receiver" is not limited to an apparatus performing reception only, but also refers to the receiving section of a communication apparatus that transmits and receives. One communication apparatus can comprise both a "transmitter" and a "receiver" as are described below.

In the figures used to explain embodiments of the present invention, elements that are functional blocks performing various processes can each be constituted by a processor and memory, or other circuits in terms of hardware, or realized by a program or the like loaded in a memory in terms of software. Thus, those skilled in the art will understand that these functional blocks can each be realized in various forms by only hardware, only software, or a combination thereof, not being limited to any form.

First Exemplary Embodiment

Figure 1:
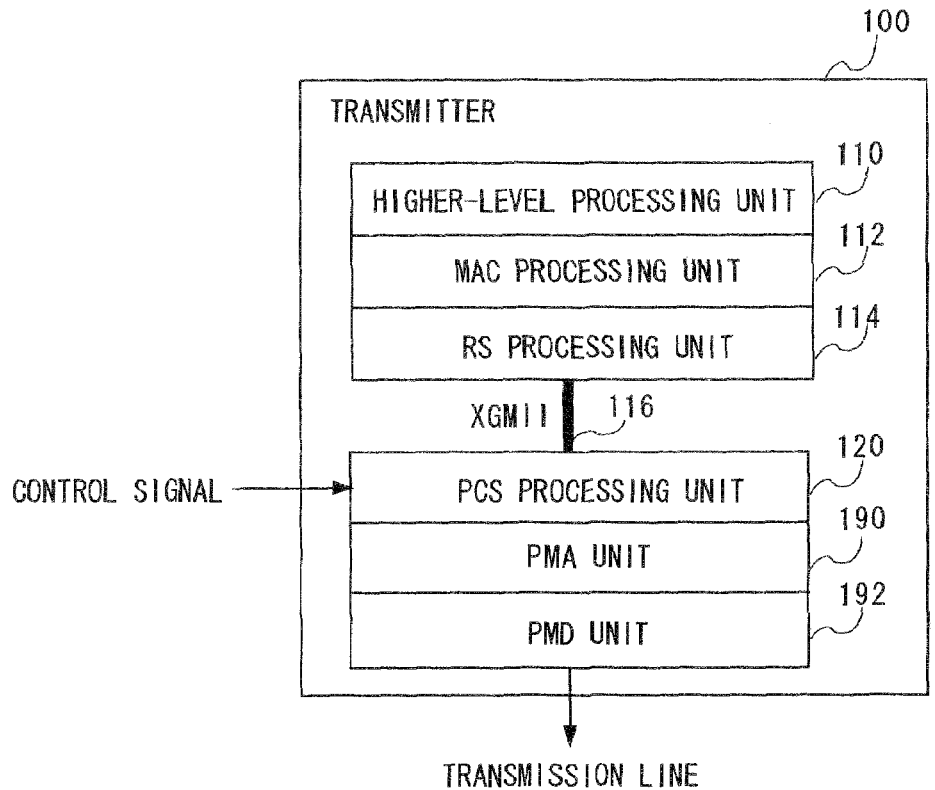
FIG. 1 shows a transmitter according to a first embodiment of the present invention.

FIG. 1 shows the divided functional layers of a transmitter 100 according to a first embodiment of the present invention. The transmitter 100 conforms to 10 Gigabit Ethernet, here 10 GBASE-R PHY and comprises a higher-level processing unit 110, a MAC processing unit 112, an RS processing unit 114, an XGMII 116, a PCS processing unit 120, a PMA unit 190, and a PMD unit 192.

The higher-level processing unit 110 performs processing for the higher layer than MAC layer and outputs to-be-transmitted data to the MAC processing unit 112. The MAC processing unit 112 performs processing for MAC layer and outputs the processed data to the RS processing unit 114.

The RS processing unit 114 to the PMA unit 190 function as a LAN PHY device of the transmitter 100. The RS processing unit 114 converts data of MAC layer into a signal of XGMII and outputs the converted data via the XGMII 116 to the PCS processing unit 120. The PCS processing unit 120 performs the 64B/66B conversion and scrambling on the data received via the XGMII 116 from the RS processing unit 114 and outputs the processed data to the PMA unit 190. The PMA unit 190 serializes the parallel data received from the PCS processing unit 120 into a bit stream and outputs to the PMD unit 192. The PMD unit 192 performs photoelectric conversion on the bit stream from the PMA unit 190 to obtain an optical signal and outputs it onto a transmission line.

Figure 2:
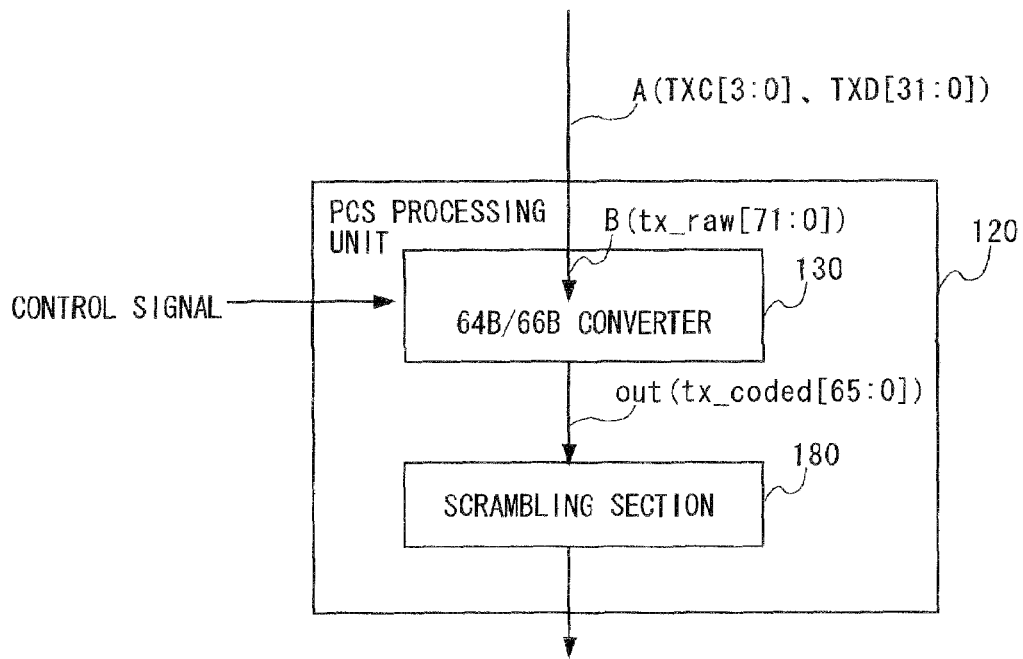
FIG. 2 shows a PCS processing unit of the transmitter shown in FIG. 1.

FIG. 2 shows the PCS processing unit 120. The PCS processing unit 120 comprises a 64B/66B converter 130 and a scrambling section 180. The 64B/66B converter 130 takes in signal A (TXC[3:0] and TXD[31:0]) from the XGMII 116 to be in the format of signal B (tx_raw[71:0]) and performs 64B/66B conversion to encode it into encoded data out (tx_coded[65:0]), which is output to the scrambling section 180. The scrambling section 180 scrambles the other 64 bits than the 2-bit sync header of the encoded data out and outputs to the PMA unit 190. The 2-bit sync header bypasses the scrambling.

Figure 3:
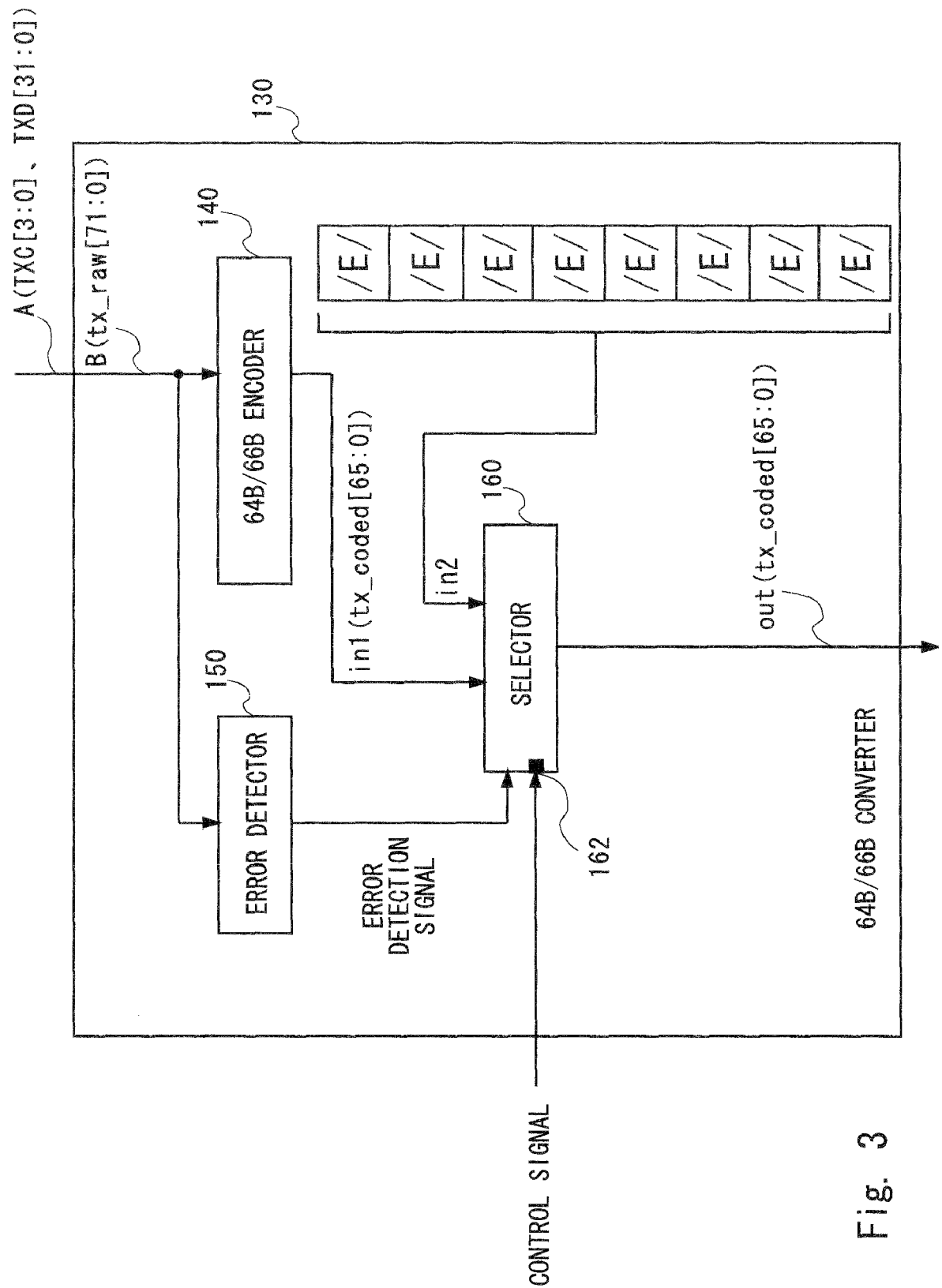
FIG. 3 shows a 64B/66B converter of the PCS processing unit shown in FIG. 2.

FIG. 3 shows the 64B/66B converter 130. The 64B/66B converter 130 comprises a 64B/66B encoder 140, an error detector 150, and a selector 160, which is provided with a control signal input terminal 162.

The 64B/66B encoder 140 takes in signal A from the XGMII 116 to be in the format of signal B and encodes it into encoded data in1 (tx_coded[65:0]) by a 64B/66B method. The formats of signal A, signal B, and encoded data in1 are respectively the same as those of signal A, signal B, and signal C (tx_coded[65:0]) described for 10 GBASE-R PHY, and thus detailed description thereof is omitted.

The error detector 150 performs error detection on a block (two columns between adjacent 8-byte boundaries) that is to be encoded by the 64B/66B encoder 140 and renders an error detection signal high if an error code is detected and low if not detected.

The control signal indicates a normal operation mode or an analysis mode and indicates the analysis mode when high and the normal operation mode when low. The control signal is input via the control signal input terminal 162 to the selector 160.

The selector 160 selects either 64-bit data of the encoded data in1 output from the 64B/66B encoder 140 or 64-bit error data in2 to be 64-bit data of the encoded data out (tx_coded [65:0]) that is output to the scrambling section 180 based on the error detection signal from the error detector 150 and the control signal input via the control signal input terminal 162. In the figure, the error data in2 consists of eight of the error code /E/, which is 8 bits wide. Note that the bit pattern of the error code /E/ is 1Eh in hexadecimal.

Figure 5:
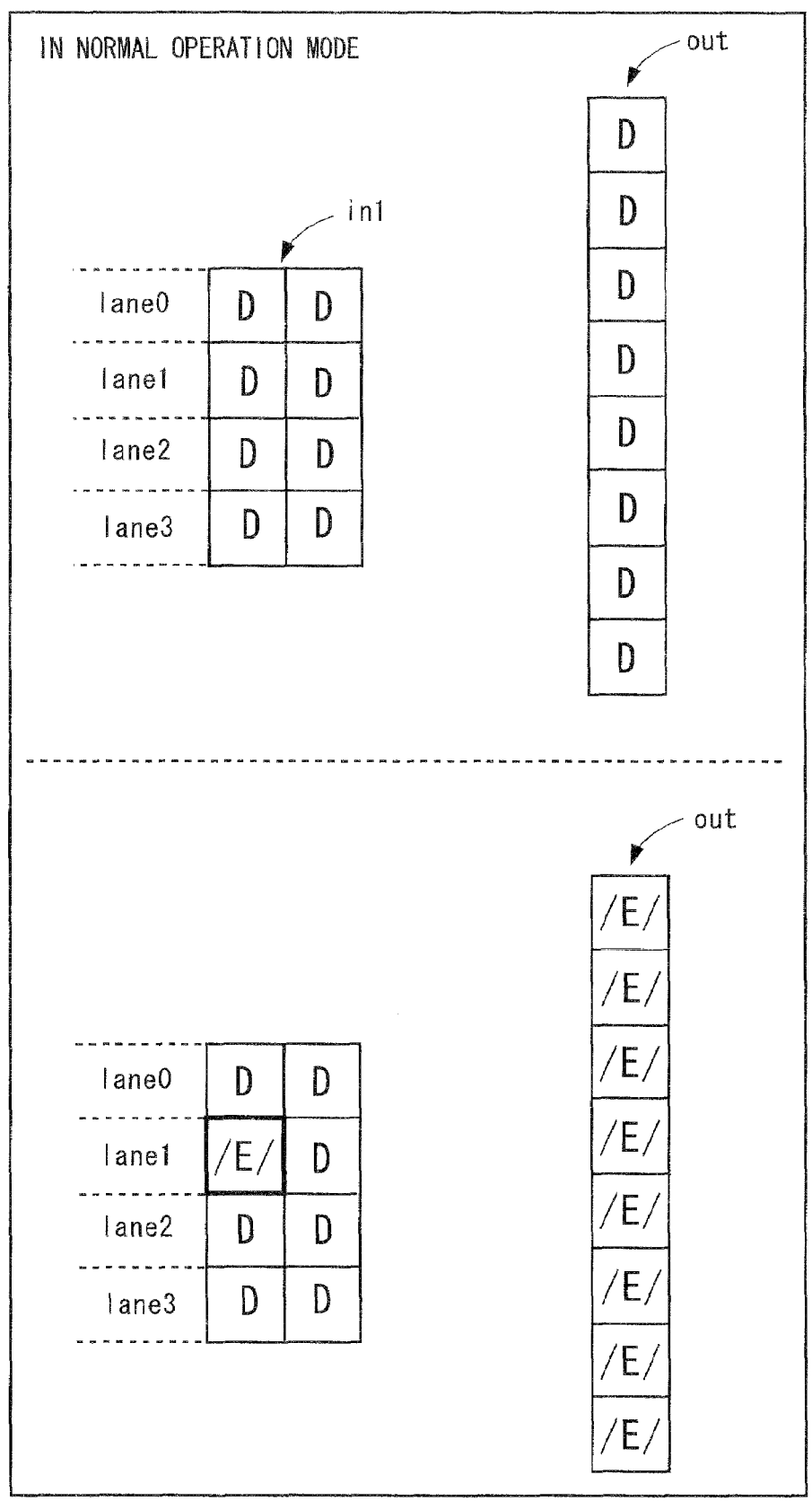
FIG. 5 shows data before and after 64B/66B conversion by the 64B/66B converter shown in FIG. 3 (when in a normal operation mode)
Figure 6:
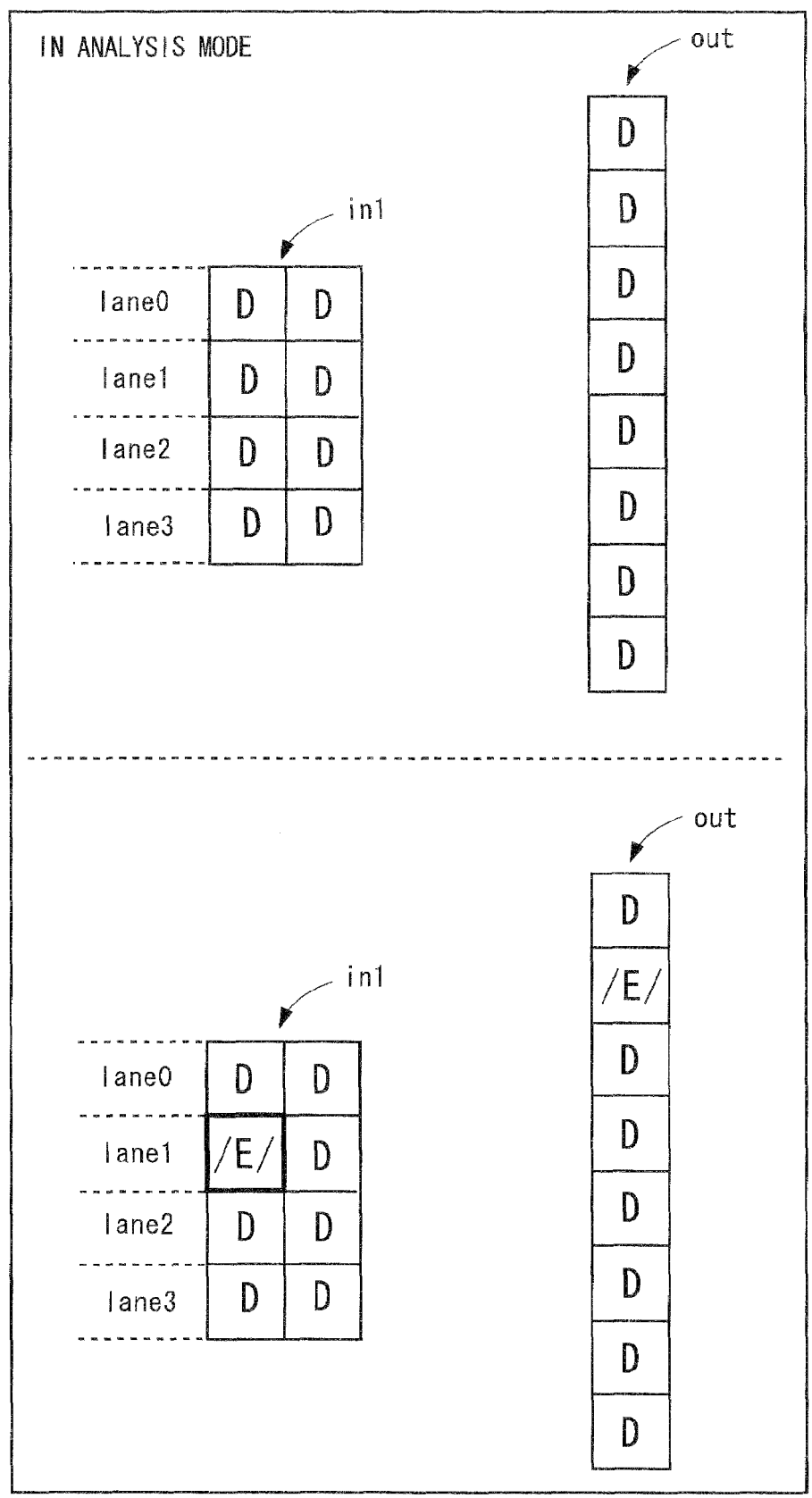
FIG. 6 shows data before and after 64B/66B conversion by the 64B/66B converter shown in FIG. 3 (when in an analysis mode)

The encoded data out comprises a 2-bit sync head and 64-bit data as the encoded data in1 does. Only the data portions of the encoded data in1 and of the encoded data out are shown in FIGS. 5, 6 for explicitness.

The process in the selector 160 will be described in detail with reference to FIGS. 4 to 6. First, the case where the control signal is low indicating the "normal operation mode" will be described.

In the normal operation mode, when the error detection signal from the error detector 150 is low indicating that no error code exists, the selector 160 selects the encoded data in1 output from the 64B/66B encoder 140 to be the encoded data out and outputs it to the scrambling section 180. As shown in the upper of FIG. 5, in this case, the encoded data out does not include the error code /E/.

On the other hand, when the error detection signal is high indicating that an error code exists, the selector 160 selects the error data in2 consisting of 8 error codes /E/ to be 64-bit data of the encoded data out. As shown in the lower of FIG. 5, in this case, the encoded data out that is output to the scrambling section 180 is data on which error expansion has been performed so that its data portion is all error codes /E/.

This process in the normal operation mode conforms to the specification of 10 GBASE-R PHY specified in IEEE 802.3ae-2002 Clause 49.

Next, the case where the control signal is high indicating the "analysis mode" will be described. In this case, the selector 160 outputs the encoded data in1 from the 64B/66B encoder 140, as it is, as the encoded data out to the scrambling section 180, irrespective of whether the error detection signal from the error detector 150 is low or high. As shown in the upper of FIG. 6, if the data portion of the encoded data in1 does not include the error code /E/, the data portion of the encoded data out will not include the error code /E/ either. In contrast, as shown in the lower of FIG. 6, if the data portion of the encoded data in1 includes the error code /E/ (FEh in hexadecimal), data in the corresponding position of the encoded data out will be the error code /E/ (1Eh in hexadecimal) with the other data being non-erroneous.

That is, in the 64B/66B conversion, the 64B/66B converter 130 of the transmitter 100 of the present embodiment performs error expansion as well as encoding when in the normal operation mode and performs encoding but not error expansion when in the analysis mode.

By this means, the transmitter 100 can perform processing conforming to 10 GBASE-R PHY when in the normal operation mode and, when performing error analysis or test, can find the accurate position of the error code /E/, and thus the detailed content analysis of an erroneous frame can be executed. Further, by transmitting non-erroneous frames, it can be analyzed whether an error occurs on the transmission line between the transmitter side and the receiver side. Moreover, when performing error analysis or test, even if the error code /E/ is located near the end code /T/, the end code /T/ is not overwritten, and hence error factors of count values of frame attributes counted by the receiver side can be reduced in number.

Second Exemplary Embodiment

Figure 7:
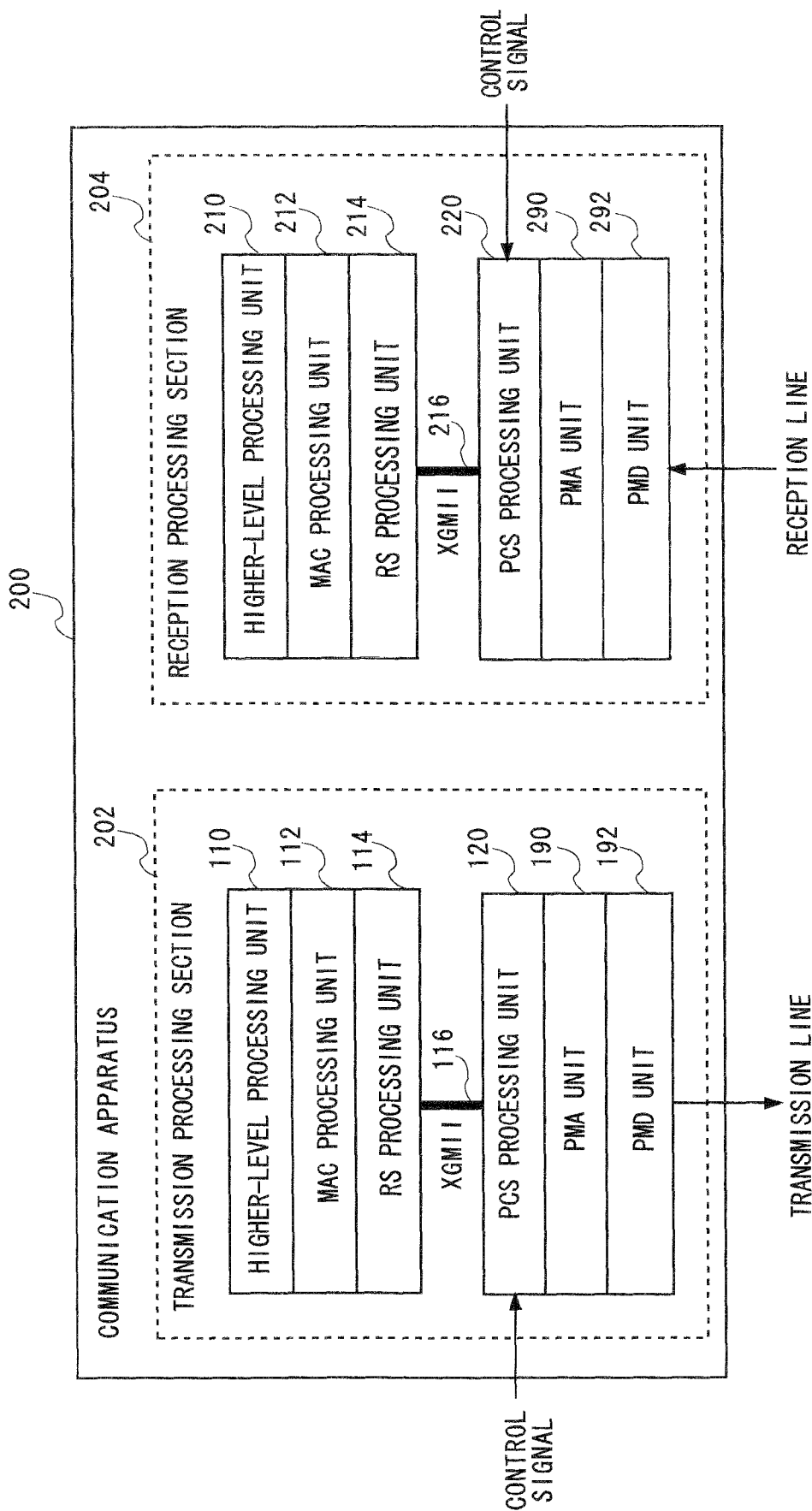
FIG. 7 shows a communication apparatus 200 according to a second embodiment of the present invention.

FIG. 7 shows a communication apparatus 200 according to a second embodiment of the present invention The communication apparatus 200 also conforms to 10 GBASE-R PHY and comprises a transmission processing section 202 and a reception processing section 204.

The transmission processing section 202 is in charge of transmission processing in the communication apparatus 200 and has the same configuration as the transmitter 100 of FIG. 1. In FIG. 7, functional blocks which perform the same operations as corresponding ones of the transmitter 100 are denoted by the same reference numerals as in FIG. 1, and detailed description thereof is omitted.

The reception processing section 204 is in charge of reception processing in the communication apparatus 200 and comprises a PMD unit 292, a PMA unit 290, a PCS processing unit 220, an XGMII 216, an RS processing unit 214, a MAC processing unit 212, and a higher-level processing unit 210. The higher-level processing unit 210 and the MAC processing unit 212 perform the same operations as corresponding functional blocks of a receiver of usual Ethernet. The PMD unit 292 to the RS processing unit 214 function as a LAN PHY device on the receiver side of the communication apparatus 200.

The PMD unit 292 performs photoelectric conversion on a signal from a reception line to obtain an electrical signal that is a bit stream and outputs it to the PMA unit 290. The PMA unit 290 parallelizes the bit stream from the PMD unit 292 into parallel data and outputs to the PCS processing unit 220. The PCS processing unit 220 performs descrambling and 64B/66B conversion on the parallel data from the PMA unit 290 to obtain decoded data and outputs it via the XGMII 216 to the RS processing unit 214. The RS processing unit 214 performs the opposite of the conversion in the RS processing unit on the transmitter side on the data received from the XGMII 216 and outputs to the MAC processing unit 212.

In the reception processing section 204, the formats of data flowing between functional blocks are the same as those of data flowing through corresponding parts of the transmission processing section 202 except that data flows from lower layers to higher layers.

Figure 8:
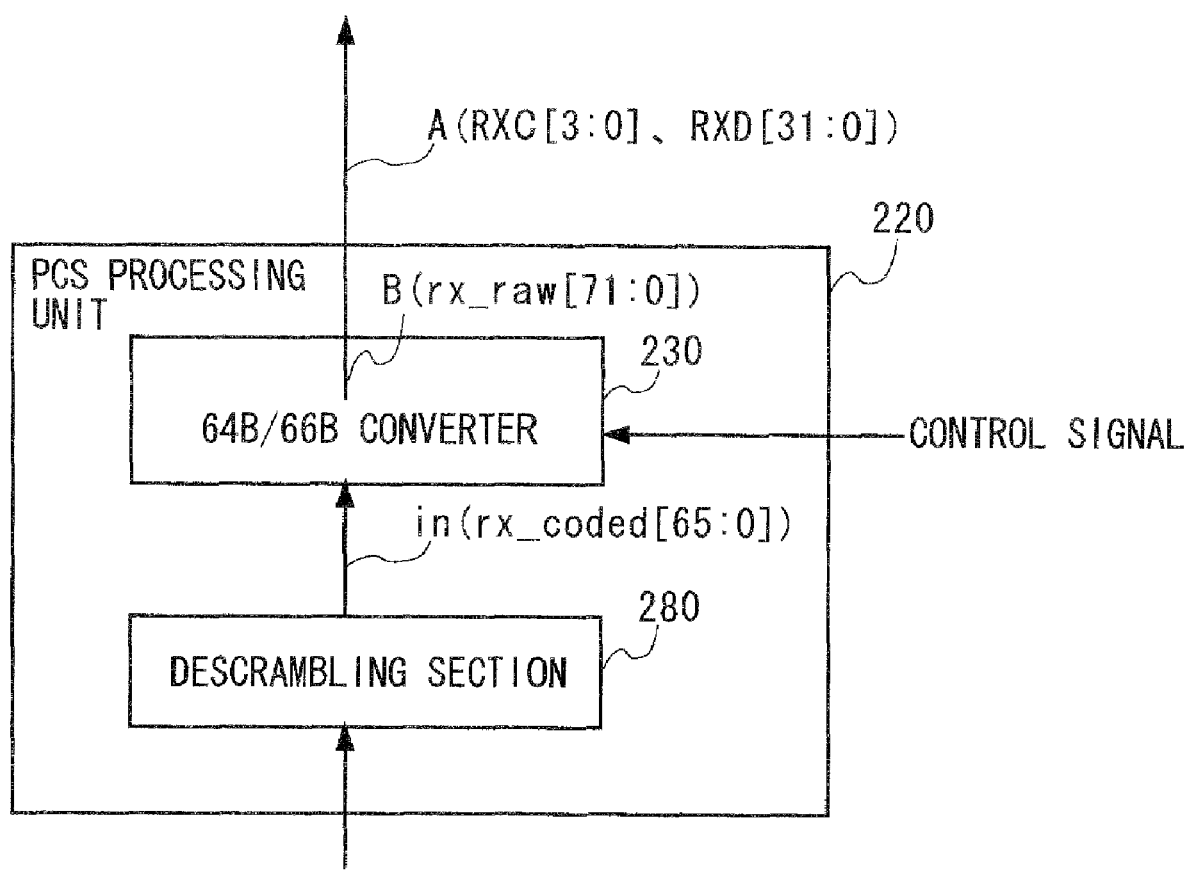
FIG. 8 shows a PCS processing unit 220 of the communication apparatus shown in FIG. 7.

FIG. 8 shows the PCS processing unit 220. The PCS processing unit 220 comprises a descrambling section 280 and a 64B/66B converter 230. The descrambling section 280 descrambles data from the PMA unit 290 and outputs encoded data in (rx_coded[65:0]) to the 64B/66B converter 230. The 64B/66B converter 230 decodes the encoded data in into signal B, decoded data, and divides the signal B into two halves to output one half per cycle in the data format of signal A of the XGMII 216 to the XGMII 216.

Figure 9:
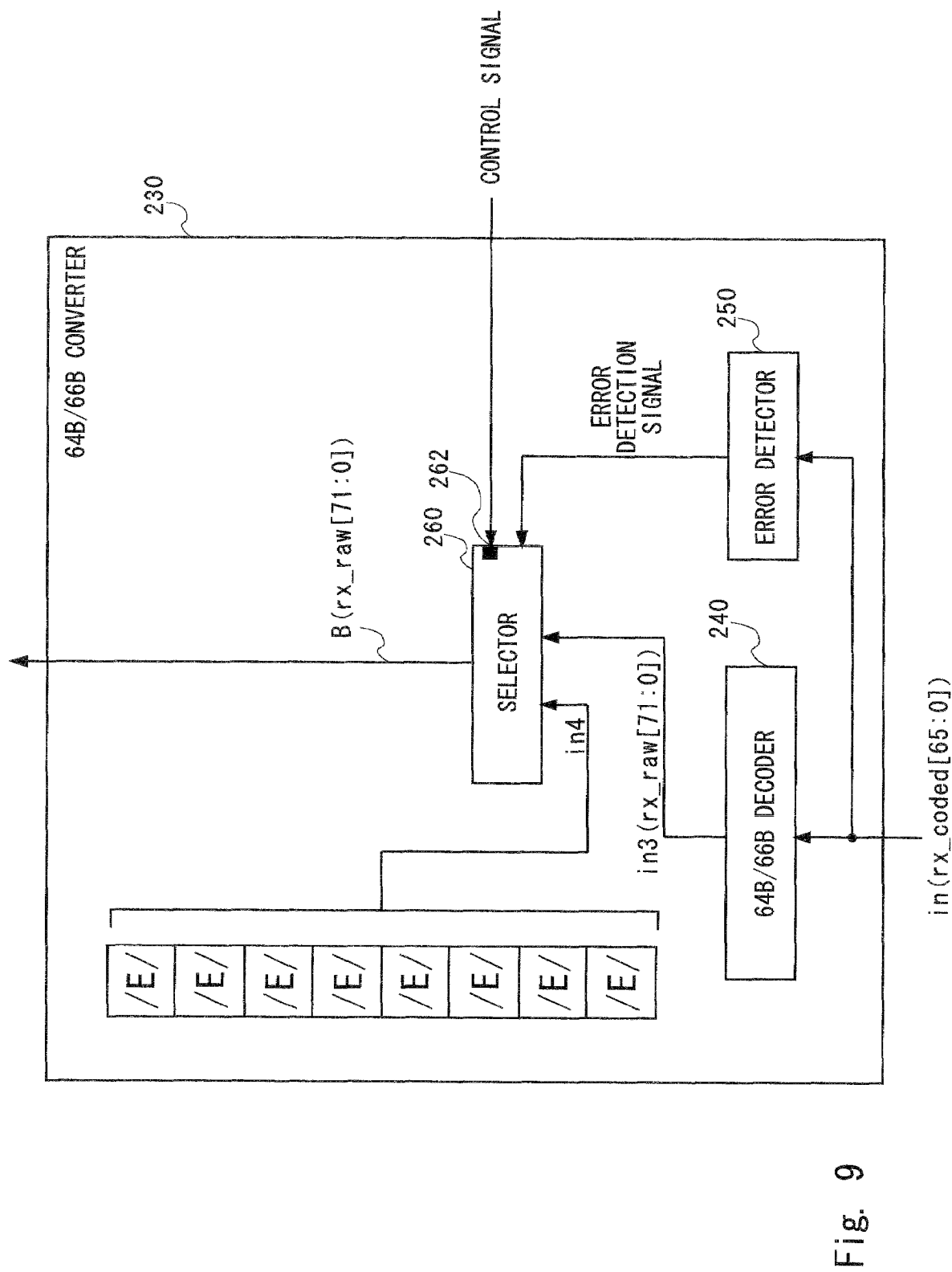
FIG. 9 shows a 64B/66B converter 230 of the PCS processing unit 220 shown in FIG. 8.
Figure 10:
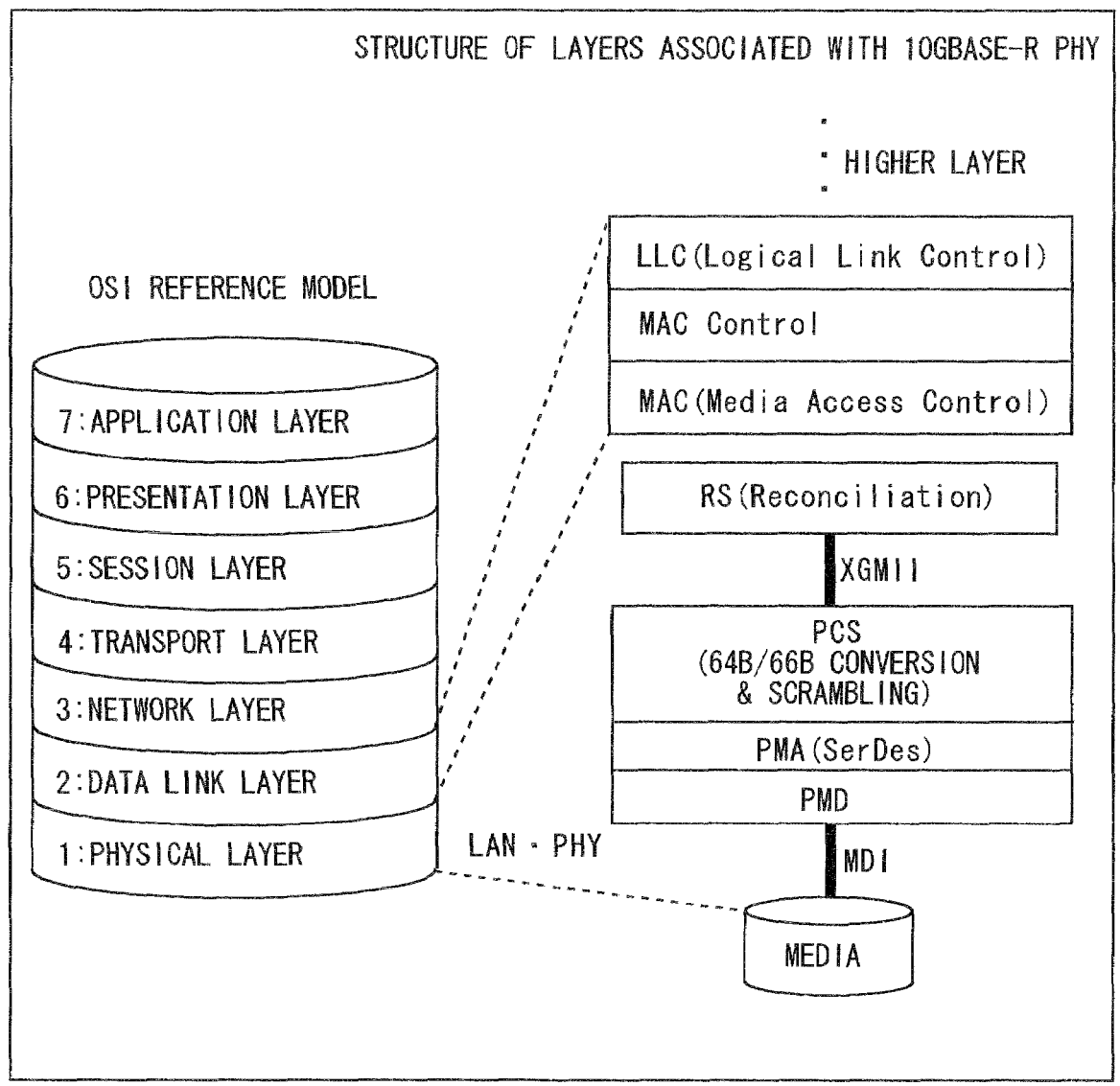
FIG. 10 shows the structure of 10 GBASE-R PHY and associated layers.
Figure 11:
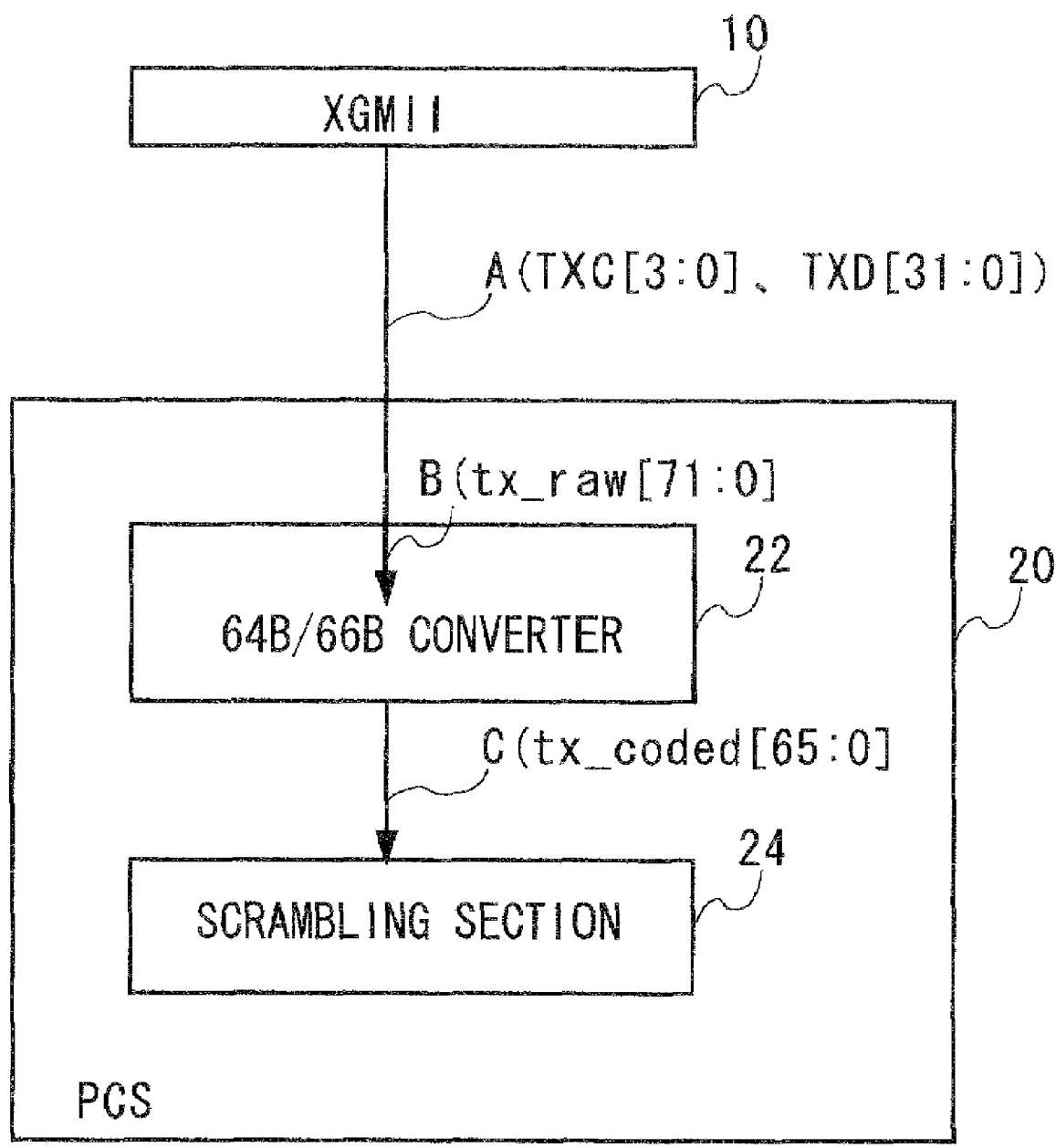
FIG. 11 is a view for explaining the 64B/66B conversion.
Figure 12:
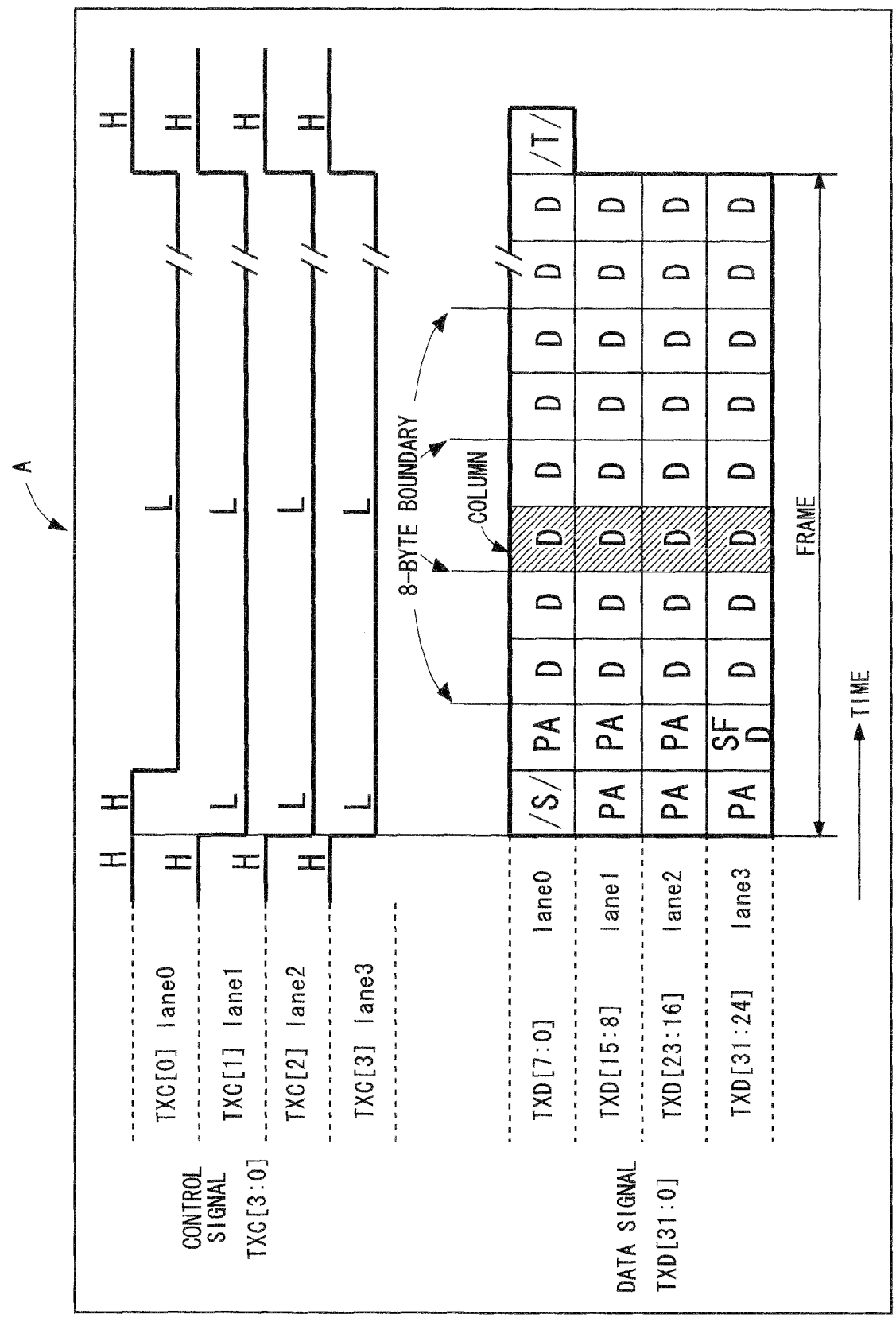
FIG. 12 shows the format of frame data flowing through XGMII.
Figure 13:
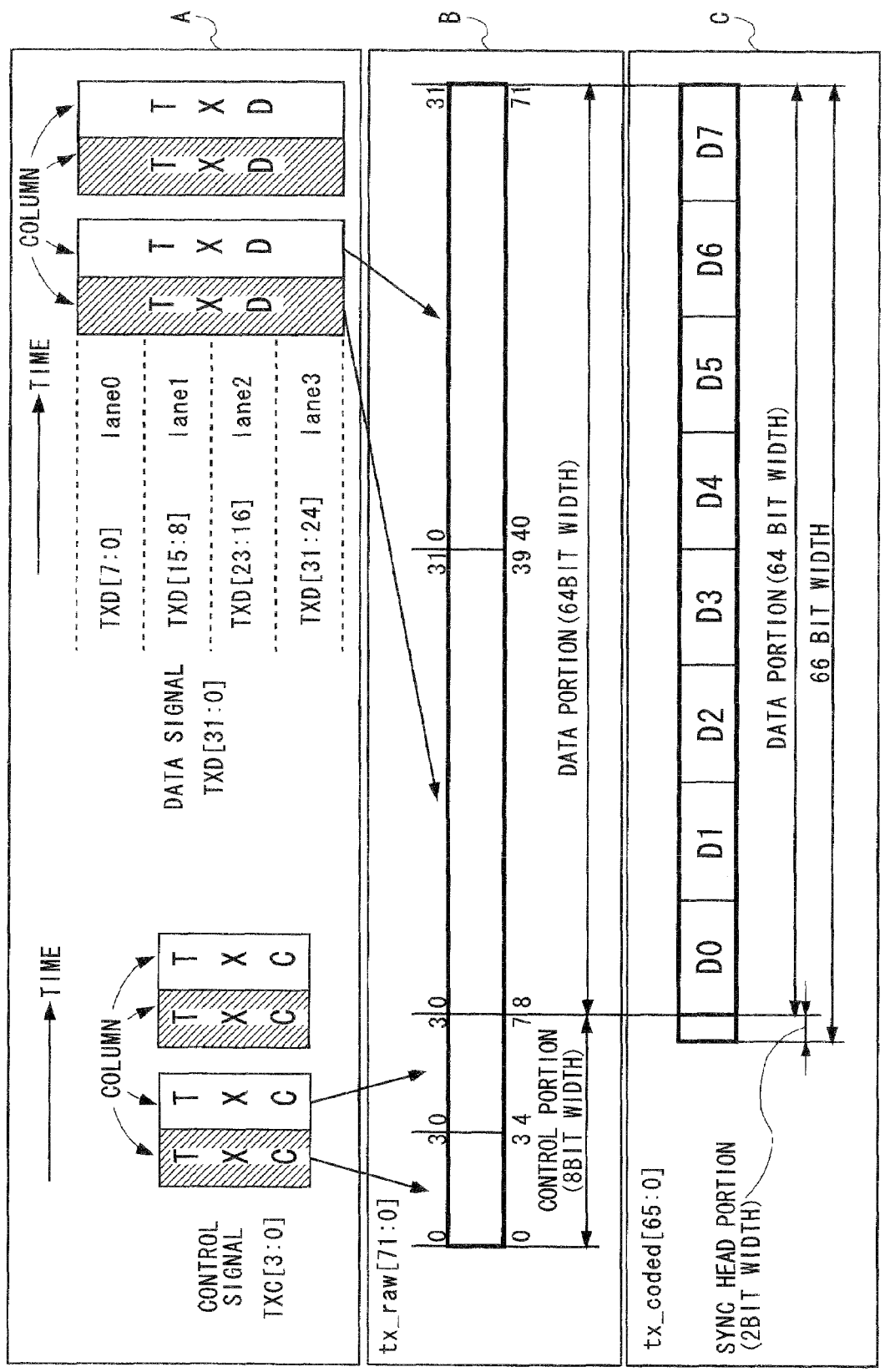
FIG. 13 shows changes in the format of data in the 64B/66B conversion.
Figure 14:
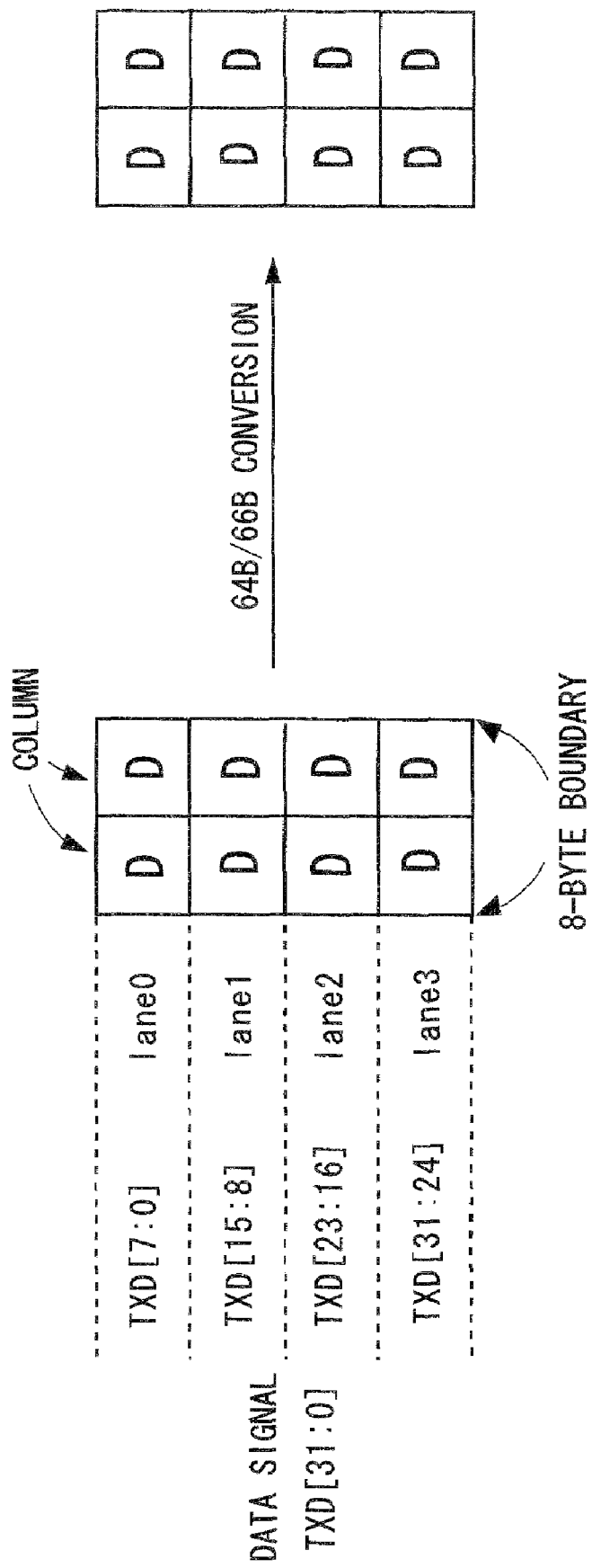
FIG. 14 is a view for explaining the 64B/66B conversion when no error code exists.
Figure 15:
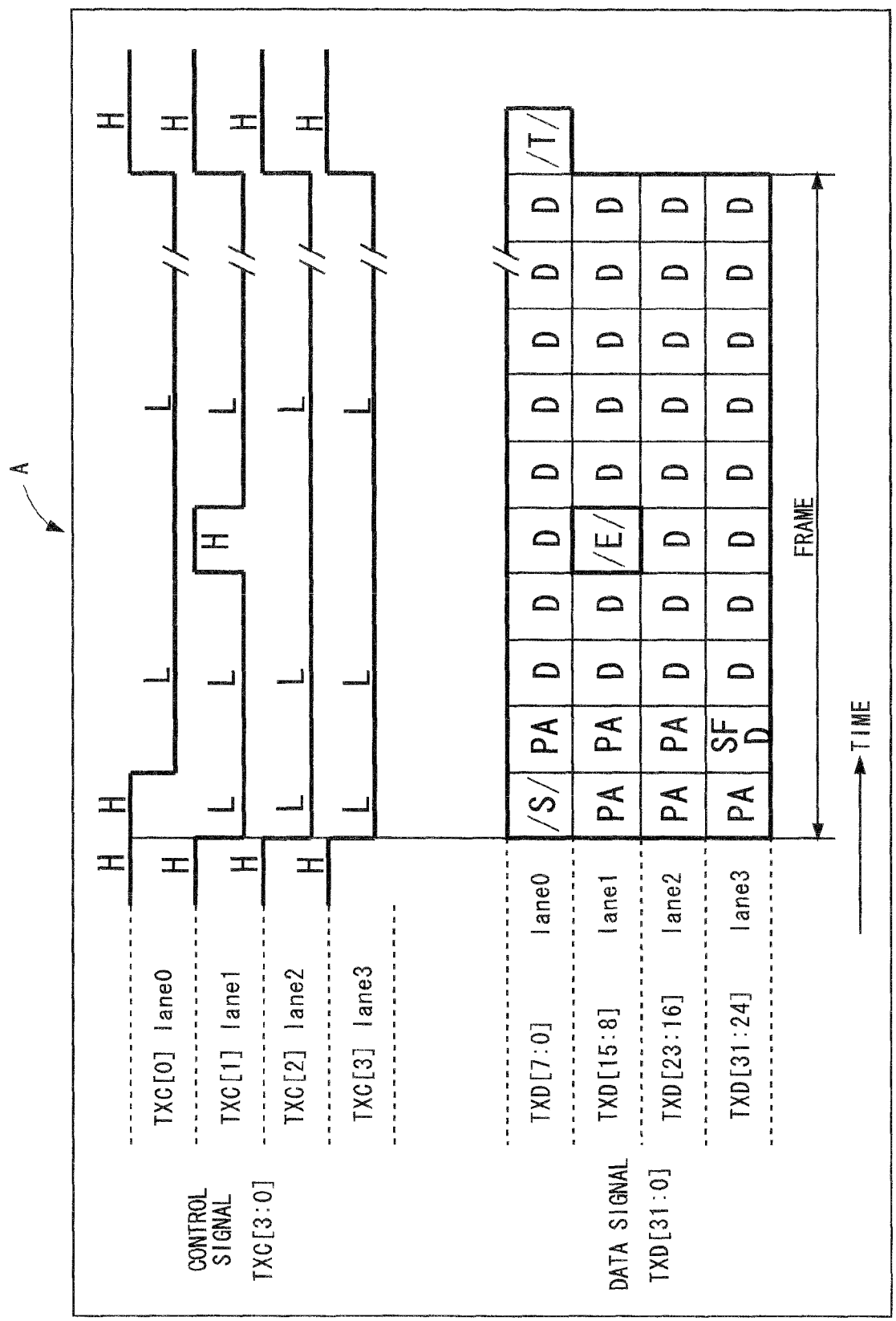
FIG. 15 shows an example of frame data flowing through XGMII when an error code exists.
Figure 16:
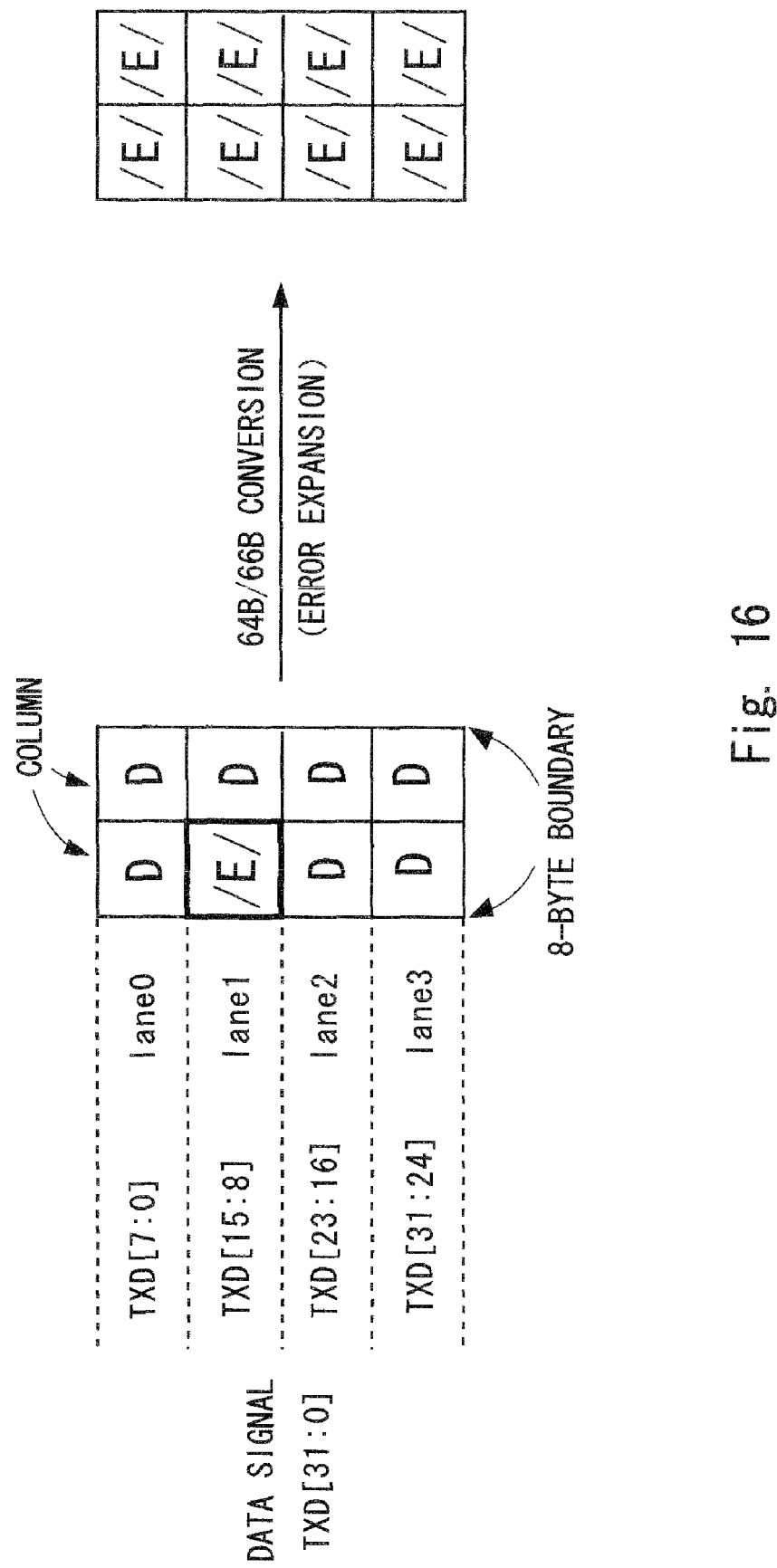
FIG. 16 is a view for explaining error expansion in the 64B/66B conversion (part 1)
Figure 17:
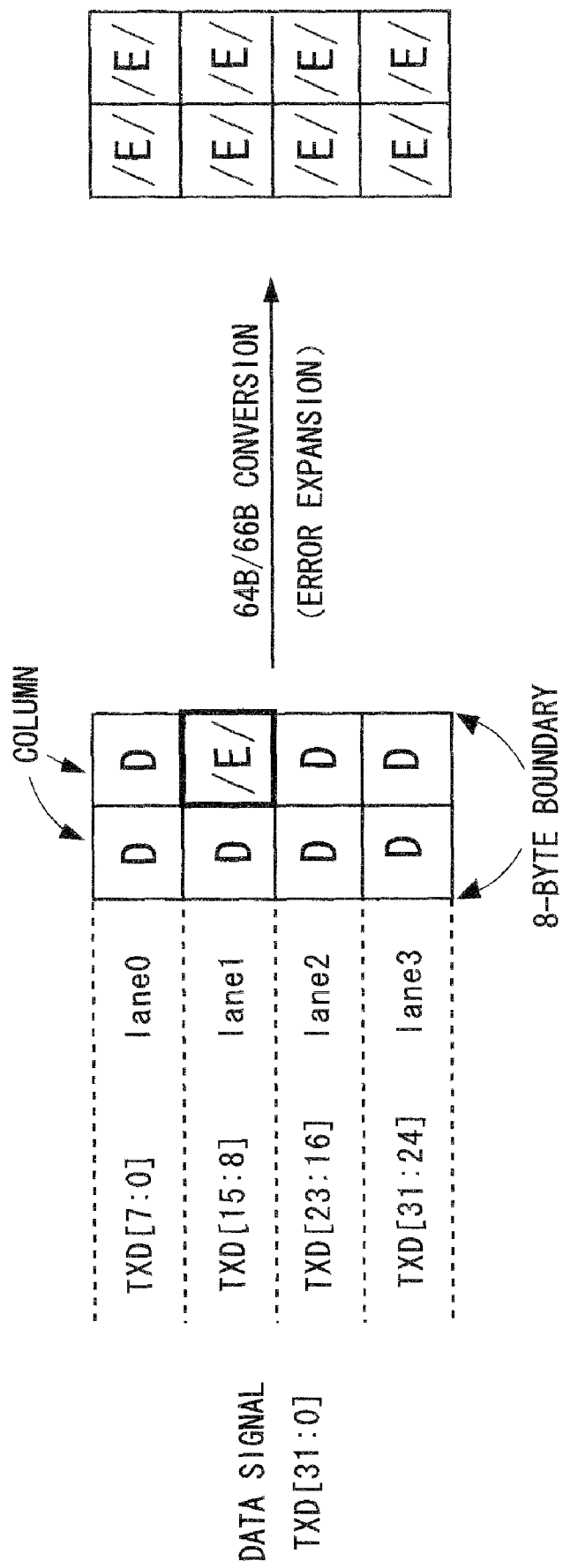
FIG. 17 is a view for explaining the error expansion in the 64B/66B conversion (part 2)
Figure 18:
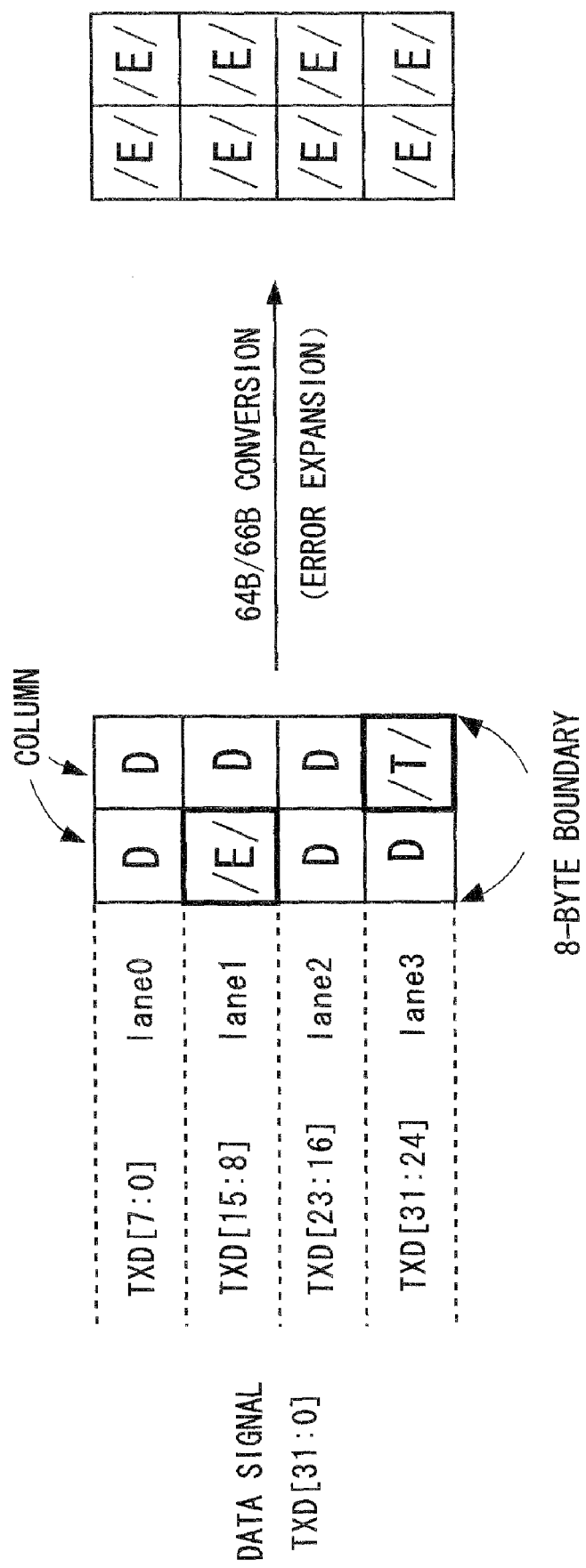
FIG. 18 is a view for explaining the problem that the end code /T/ of a frame is overwritten by the error expansion.

FIG. 9 shows the 64B/66B converter 230. The 64B/66B converter 230 comprises a 64B/66B decoder 240, an error detector 250, and a selector 260, which is provided with a control signal input terminal 262.

The 64B/66B decoder 240 decodes the encoded data in from the descrambling section 280 by the 64B/66B method into decoded data in3 (rx_raw[71:0]).

The error detector 250 performs error detection on a block (two columns between adjacent 8-byte boundaries) that is to be decoded by the 64B/66B decoder 240 and renders an error detection signal high if an error code is detected and low if not detected.

The control signal indicates a normal operation mode or an analysis mode and indicates the analysis mode when high and the normal operation mode when low. The control signal is input via the control signal input terminal 262 to the selector 260.

The selector 260 selects either 64-bit data of the decoded data in3 output from the 64B/66B decoder 240 or 64-bit error data in4 to be 64-bit data of the signal B that is output to the XGMII 216 based on the error detection signal from the error detector 250 and the control signal input via the control signal input terminal 262. In the figure, the error data in4 consists of eight of the error code /E/, which is 8 bits wide. Note that the bit pattern of the error code /E/ is FEh in hexadecimal.

As the selector 160 in FIG. 3 does, in the normal operation mode, the selector 260 outputs the decoded data in3 output from the 64B/66B decoder 240, as it is, as the output data (signal B) of the 64B/66B converter 230 if no error code is detected and selects the error data in4 to be data of the signal B if an error code is detected. In contrast, in the analysis mode, the selector 260 outputs the decoded data in3 from the 64B/66B decoder 240, as it is, as the signal B, irrespective of whether an error code exists or not.

That is, in the 64B/66B conversion, the 64B/66B converter 230 performs error expansion as well as decoding when in the normal operation node and performs decoding but not error expansion when in the analysis mode.

By this means, where error analysis is performed in any of the functional blocks subsequent to the 64B/66B converter 230, the same effect can be produced as in the transmitter 100 of FIG. 1.

The present invention has been described by way of embodiments. The embodiments are illustrative, and various modifications and additions/subtractions can be made thereto without departing from the scope of the invention. It will be understood by those skilled in the art that variants having those modifications and additions/subtractions made thereto are within the scope of the invention.

For example, in the above embodiments, the functional blocks of MAC layer, RS layer, and PCS layer and lower are integrated. Thus, XGMII need not be output outside, and hence data 64 bits wide can be passed, as it is, between RS layer and PCS layer without reducing the data width to 32 bits of XGMII. Thus, the clock frequency for the data can be reduced in half. The technique of the present invention can be applied to devices comprising only functional blocks of PCS layer and lower.

Moreover, while the above embodiments are examples where the technique of the present invention is applied to the LAN PHY of 10 GBASE-R PHY, of course the technique of the invention can be applied to the LAN PHY of 10 Gigabit Ethernet devices conforming to other specifications and performing 64B/66B conversion, and to devices conforming to a specification, if any, where 64B/66B conversion is performed in the WAN PHY.

Further, not being limited to devices performing 64B/66B conversion, the technique of the invention can be applied to any data converting device which performs data conversion on data on a block basis that is transmitted over multiple lanes, the block being formed of a predetermined number of columns, the data conversion being accompanied by error expansion.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

Furthermore, the first and second exemplary embodiments can be combined as desirable by one of ordinary skill in the art.

What is claimed is:

1. A data processing apparatus comprising:
a memory;
an error detector to detect an error code in data that is transmitted over a plurality of lanes;
a data converter to perform data conversion on the data on a block basis, the block being formed of a predetermined number of columns; and
a control signal input terminal via which to input a control signal indicating a normal operation mode or an analysis mode,
wherein the data converter, when the control signal inputted via the control signal input terminal indicates the normal operation mode, performs error expansion that replaces each data in a block where the error code detected by the error detector exists with an error code and,
when the control signal inputted via the control signal input terminal indicates the analysis mode, does not perform the error expansion.

2. The data processing apparatus according to claim 1, which is provided in a transmitter.

3. The data processing apparatus according to claim 1, which is provided in a receiver.

4. The data processing apparatus according to claim 1, which conforms to 10 Gigabit Ethernet and is provided in a physical layer.

5. The data processing apparatus according to claim 2, which conforms to 10 Gigabit Ethernet and is provided in a physical layer.

6. The data processing apparatus according to claim 3, which conforms to 10 Gigabit Ethernet and is provided in a physical layer.

7. The data processing apparatus according to claim 1, wherein the data converter performs 64B/66B conversion.

8. The data processing apparatus according to claim 2, wherein the data converter performs 64B/66B conversion.

9. The data processing apparatus according to claim 3, wherein the data converter performs 64B/66B conversion.

10. The data processing apparatus according to claim 4, wherein the data converter performs 64B/66B conversion.

11. The data processing apparatus according to claim 5, wherein the data converter performs 64B/66B conversion.

12. The data processing apparatus according to claim 6, wherein the data converter performs 64B/66B conversion.

13. A data processing method which performs data conversion on data on a block basis that is transmitted over a plurality of lanes, the block being formed of a predetermined number of columns, wherein:
if an error code in a block to be converted is detected, according to a control signal, when the control signal indicates a normal operation mode, error expansion that replaces each data in the block to be converted with an error code is performed, and when the control signal indicates an analysis mode, the error expansion is not performed.

14. The data processing method according to claim 13, wherein the data conversion is 64B/66B conversion.

15. A data processing system comprising:
a memory; and
a program loaded in the memory to make a computer execute a conversion process which performs data conversion on data on a block basis that is transmitted over a plurality of lanes, the block being formed of a predetermined number of columns, the conversion process wherein:
if an error code in a block to be converted is detected, according to a control signal, when the control signal indicates a normal operation mode, error expansion that replaces each data in the block to be converted with an error code is performed, and when the control signal indicates an analysis mode, the error expansion is not performed.

16. The data processing system according to claim 15, wherein the data conversion is 64B/66B conversion.

* * * * *